US011417966B2

(12) United States Patent
Schnoerch et al.

(10) Patent No.: US 11,417,966 B2
(45) Date of Patent: Aug. 16, 2022

(54) ELECTRICAL CRIMP CONNECTOR WITH A TAIL

(71) Applicant: AGC GLASS EUROPE, Louvain-la-Neuve (BE)

(72) Inventors: Peter Schnoerch, Brussels (BE); Csaba Morocz, Gosselies (BE)

(73) Assignee: AGC GLASS EUROPE, Louvain-la-Neuve (BE)

( * ) Notice: Subject to any disclaimer, the term of this patent is extended or adjusted under 35 U.S.C. 154(b) by 46 days.

(21) Appl. No.: 16/768,797

(22) PCT Filed: Dec. 4, 2018

(86) PCT No.: PCT/EP2018/083441
§ 371 (c)(1),
(2) Date: Jun. 1, 2020

(87) PCT Pub. No.: WO2019/110564
PCT Pub. Date: Jun. 13, 2019

(65) Prior Publication Data

US 2021/0184374 A1 Jun. 17, 2021

(30) Foreign Application Priority Data

Dec. 4, 2017 (EP) .................................... 17205210

(51) Int. Cl.
*H05K 1/00* (2006.01)
*H01R 4/18* (2006.01)
(Continued)

(52) U.S. Cl.
CPC ............ *H01R 4/184* (2013.01); *H01R 4/028* (2013.01); *H01R 43/0235* (2013.01);
(Continued)

(58) Field of Classification Search
CPC ......... H05K 1/0206; H01R 4/18; H01R 4/187
See application file for complete search history.

(56) References Cited

U.S. PATENT DOCUMENTS 8,245,396 B2 * 8/2012 Kondo ................ H01R 13/035 29/863
2015/0236431 A1 * 8/2015 Schmalbuch .......... H01R 12/53 174/252

(Continued)

FOREIGN PATENT DOCUMENTS

DE 20 2013 006 780 U1 10/2013
DE 20 2013 006 781 U1 10/2013

(Continued)

OTHER PUBLICATIONS

International Search Report dated Mar. 15, 2019 in PCT/EP2018/083441 filed Dec. 4, 2018.

*Primary Examiner* — Phuong Chi Thi Nguyen
(74) *Attorney, Agent, or Firm* — Oblon, McClelland, Maier & Neustadt, L.L.P.

(57) ABSTRACT

A glazing panel which comprises an electrical connector with a tail to avoid a wicking effect. The glazing panel is particularly suitable for a vehicle glazing comprising an electrically conductive connector connected to electrically conductive structure such as a heat-able coating or an antenna.

10 Claims, 2 Drawing Sheets

(51) Int. Cl.
*H01R 4/02* (2006.01)
*H01R 43/02* (2006.01)
*H01R 43/048* (2006.01)
*H05B 3/84* (2006.01)

(52) U.S. Cl.
CPC ............. *H01R 43/048* (2013.01); *H05B 3/84* (2013.01); *H01R 2201/02* (2013.01); *H01R 2201/26* (2013.01)

(56) References Cited

U.S. PATENT DOCUMENTS

| | | | |
|---|---|---|---|
| 2015/0264800 | A1 | 9/2015 | Schmalbuch et al. |
| 2015/0296569 | A1 | 10/2015 | Rateiczak et al. |
| 2018/0048079 | A1 | 2/2018 | Schmalbuch et al. |
| 2018/0220523 | A1 | 8/2018 | Schmalbuch et al. |
| 2018/0330845 | A1 | 11/2018 | Reul et al. |

FOREIGN PATENT DOCUMENTS

| | | | |
|---|---|---|---|
| WO | WO 2014/079595 | A1 | 5/2014 |
| WO | WO 2016/096248 | A1 | 6/2016 |

* cited by examiner

ELECTRICAL CRIMP CONNECTOR WITH A TAIL

TECHNICAL DOMAIN OF THE INVENTION

The present invention relates to glazing panel, which comprises an electrical connector. More particularly, the present invention relates to a vehicle glazing, which comprises electrically conductive connector connected to electrically conductive structure, for instance heatable coating or antenna.

BACKGROUND OF THE INVENTION

Nowadays, more and more glazing panels are functional assemblies such as lighting, privacy, video, sound, heating functions, antennas and much more other functions.

These functional elements are deposited on the glazing panel as an electrically conductive structure. In this way, to work, to communicate, to be powered, . . . these electrically conductive structure needs to be linked to the outside of the glazing panel via a cable crimped with an electrical crimp connector soldered on the electrically conductive structure.

The cable is typically made of metal surrounded by a plastic film. To be crimped correctly and efficiently, the plastic film of the cable is removed only at the crimping region. The plastic film allows to protect the cable and to isolate it. The metal part is made of at least one metal fiber. Depending of the current passing through the cable and the quality of the cable, the metal part can be made of a plurality of fibers. This plurality of fibers can be twisted. The plastic part of the cable allows to maintain fibers together.

An electrical crimp connector is an element able to crimp at least a cable. A electrical crimp connector can be implemented as an open or closed crimp. In case of open crimp, the electrical crimp connector is provided as a small plate with wings pre-bent or not. These wings are folded or bent around the cable via crimp claws. In case of close crimp, the electrical crimp connector is configured as a tube or a sleeve. The electrical crimp connector is crimped around the previously introduced inside cable. For the two cases, the electrical crimp connector is deformed around the cable to ensure it.

The electrically conductive structure can be deposited on the substrate only on the part of the panel or on the whole surface and by a coating method such as magnetron sputtering, by printing, by gluing or any other methods suitable to deposit an electrically conductive structure to a glazing panel. The electrically conductive structure can be an antenna for TV, DTV, FM, AM, . . . and designed as a wire or a plate on the substrate for example. The electrically conductive structure can be a stack of coating layers with conductive and isolative layers or a Ag, Cu, or any other suitable metallic material or mixture able to be conductive and printed, glued, . . . on the substrate.

To solder the electrical crimp connector on the electrically conductive structure, a specific amount of soldering material is necessary. If the amount of soldering material is not enough, the electrical crimp connector is not well fixed and it can be removed. Even if the right amount is used, during the soldering of the electrical crimp connector on the electrically conductive structure, the soldering material could, by capillarity also named wicking effect, rise on the cable. Due to this effect, the cable is directly soldered on the electrically conductive structure. In case of handling the glazing panel, after the step of soldering, operators have to fold the cable on the glazing panel to be able to handle this panel without damaging the cable and the whole system.

During the folding step of the cable, the operator manipulates the cable and, when the cable is soldered directly on the electrically conductive structure, stresses are applied on the electrically conductive structure and on the substrate with risk of breakage, damage, chip removal, . . . . The plastic part of the cable or the cable itself could also be damaged by the soldering material and the heat applied for the soldering.

The soldering material is any known soldering material and could be a lead-free soldering material to respect the End of live Vehicles Directives 2000/53/EC. The method of soldering can be any known soldering method for this soldering depending of material used for the substrate and any part soldered.

The following description relates to an automotive glazing panel but it is understood that the invention may be applicable to others fields like architectural glazing which may provide electrically functional component or an electrically functional layer.

The invention provides a solution to overcome these problems.

SUMMARY OF THE INVENTION

The invention relates to an improved glazing panel comprising at least a substrate with an electrically conductive structure; an electrical crimp connector soldered by soldering material to the electrically conductive structure and an electrical cable crimped with the electrical crimp connector. The invention relates also to the use of an tail to avoid the wicking effect comprising between a soldering material and a cable crimped with an electrically crimp connector. The invention relates also to an electrically crimp connector to avoid the wicking effect comprising between a soldering material and a cable crimped with an electrically crimp connector comprising a tail.

The invention relates also to the use of an electrically crimp connector to avoid the wicking effect disposed between a soldering material and a cable crimped with the electrically crimp connector.

The tail of the electrical crimp connector protrudes from the said electrical crimp connector at least at the region of the output of the said cable from the said electrical crimp connector to avoid the wicking effect between the soldering material and the cable.

The substrate can be any substrate able to receive an electrically conductive structure on it. Preferably, the substrate is a glass substrate. The glass substrate can be processed, ie annealed, tempered, . . . .

The electrically conductive structure is applied on at least one part of one surface of the substrate.

The electrically conductive structure can be a heatable structure, an antenna or any other electrically conductive structure that need to be powered or linked with a cable. The glazing panel can comprises more than one electrically conductive structure.

The nature of the cable, ie the section, allows the received power. Dimensions of electrical crimp connector can depend of the dimension of the cable.

The electrically conductive structure can be deposited by sputtering, CVD, PECVD, . . . for coating layers for example or by printing for antenna structures. The material could be any conductive material able to be deposited on the glass surface; for instance, silver, copper or aluminum printed element, metal coating structure, silver, copper or aluminum foils, . . . .

The electrical crimp connector is an element that connects an electrical cable to the electrically conductive structure. The electrical crimp connector could be made of copper or brass, aluminum, steel and stainless steel alloys, Iron nickel alloys, Titanium or any kind of conductive metal. In case of stainless steel, steel, titanium or FeNi alloys. Preferably, the surface could be plated with solderable materials (like nickel or copper or silver, or the combination of those).

The electrical crimp connector is soldered on the electrically conductive structure.

The cable is generally a metallic core with a plastic protective layer. The metallic core can be a single wire or a plurality of wires and typically made of Copper or Aluminum.

The tail of the electrically crimp connector prevents the soldering material to raise on the electrical cable.

In another embodiment, the tail of the electrically crimp connector can be made in a single element to facilitate manipulations, to reduce cost, . . . .

The soldering material solders the electrically crimp connector to the electrically conductive structure. The soldering material can be made of lead alloys or lead-free alloys depending of the legislation and/or the thermal expansion needed between the shield element and the electrically conductive structure. In another embodiment, the soldering material could be replaced by a conductive adhesive or glue.

According to the present invention, the tail protrudes, at least at the region of the output of the cable, at least with the diameter of the cable from the end of intersection of the crimp wings of the electrically crimp connector.

The output of the cable is the region where the cable is not crimped with the crimp wings.

Crimp wings are the two parts of the electrical crimp connector bended on the cable. The body is the part where the cable is crimped.

Preferably, the tail protrudes with at least 10% of the length of the intersection of the crimp wings of electrical crimp connector.

In a particular embodiment, the shape of the tail is like a plate. The edges of the tails can be rounded. The linked part between the tail and the body of the electrical crimp connector can be rounded.

FIGURES

The present invention will now be more particularly described with reference to drawings and exemplary embodiments, which are provided by way of illustration and not of limitation. The drawings are a schematic representation and not true to scale. The drawings do not restrict the invention in any way. More advantages will be explained with examples.

Figure 1:
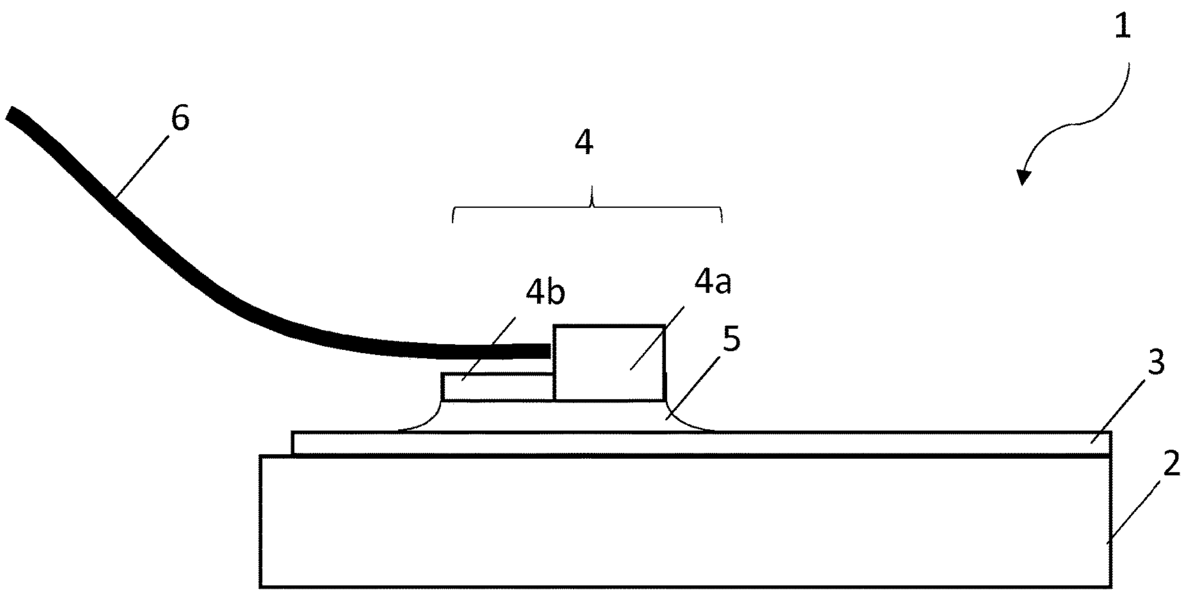
FIG. 1 is a side view of one embodiment of the glazing panel according to the invention.
Figure 2:
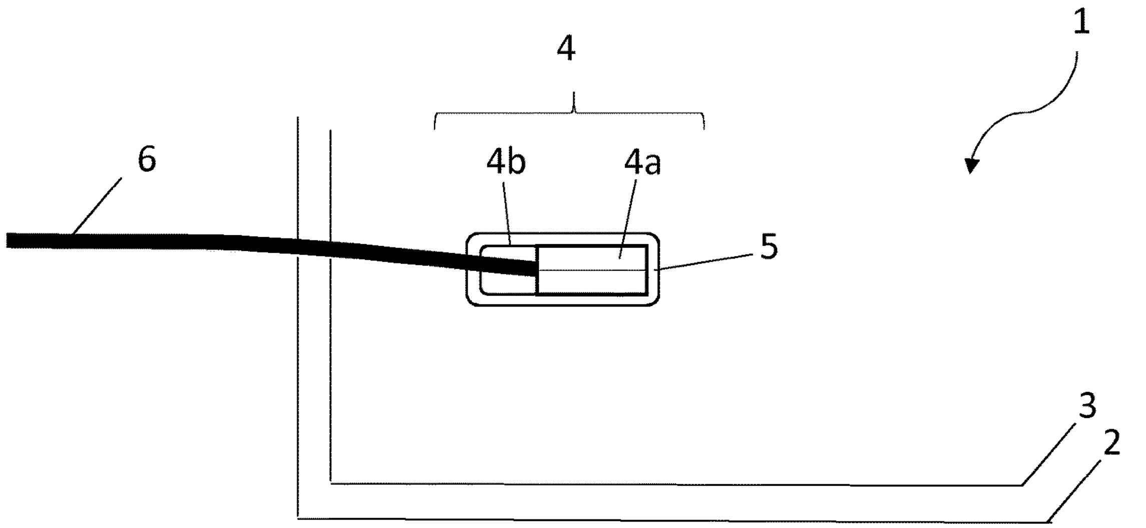
FIG. 2 is a plan view of one embodiment of the glazing panel according to the invention.

Referring to the FIG. 1 and FIG. 2, according to one embodiment of this invention, a glazing panel (1) comprises, a glass substrate (2) with an electrically conductive structure (3); an electrical crimp connector (4) fixed on the electrically conductive structure (3).

The electrical crimp connector (4) soldered by soldering material (5) on the electrically conductive structure (3). A cable (6) is crimped with the electrical crimp connector (4).

In this embodiment, the electrically conductive structure (3) is an antenna structure. The antenna is a silver layer printed on the surface of the glass substrate. In case of hidden antenna, antennas are printed in border of the glazing panel (1) and hidden by a black band. The black band can be deposited on the other surface of the glazing panel or between the glass substrate (2) and the electrically conductive structure (3). The black band can be a enamel frit deposited by silk printing.

In this embodiment, the electrical crimp connector (4) is a connector that crimps the metallic part of the cable made of Copper. The electrical crimp connector (4) comprises a body (4*a*) and a tail (4*b*). The tail (4*b*) protrudes at least the diameter of the cable (6). And preferably, the tail (4*b*) protrudes with at least 10% of the length of the intersection of the crimp wings of the electrical crimp connector (4).

During the manufacturing and the handling of the glazing panel (1), the operator manipulates and folds the cable (6) in direction of the center of glazing panel (1). Due to the tail (4*b*), no soldering material, is in contact with the cable (6) thus the cable (6) can be manipulated without risk of breakage. Thus, there is no direct connection between the glass and the wire, due to the tail, no or reduced wicking effect is possible.

Figure 3:
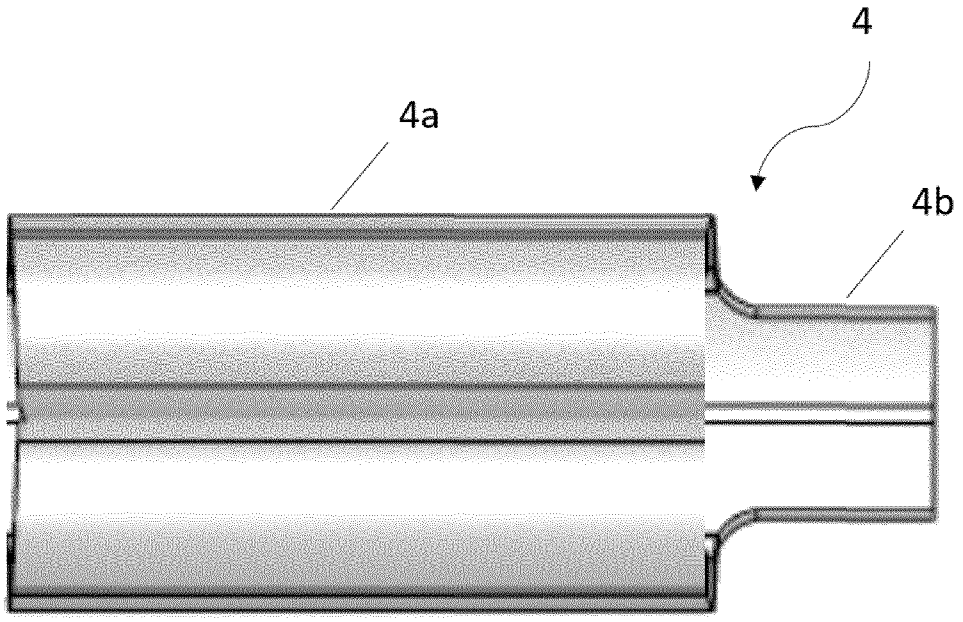
FIG. 3 is plan view of an electrical crimp connector according to the invention.

Referring to FIG. 3, according to the invention, an electrical crimp connector (4) comprises a body (4*a*) and a tail (4*b*). The body (4*a*) and the tail (4*b*) are made in a single piece. The tail (4*b*) protrudes at least 10% of the length of the electrical crimp connector (4). In one, the tail (4*b*) is about 1.8 mm, the crimp wings or the body (4*a*) is about 4.5 mm. The dimension of electrically conductive crimp depends of the cable and thus the current passing through it. In one embodiment, for a low current application i.e. below 8A The cross-section of the cable is about 0.5 $mm^2$.

Figure 4:
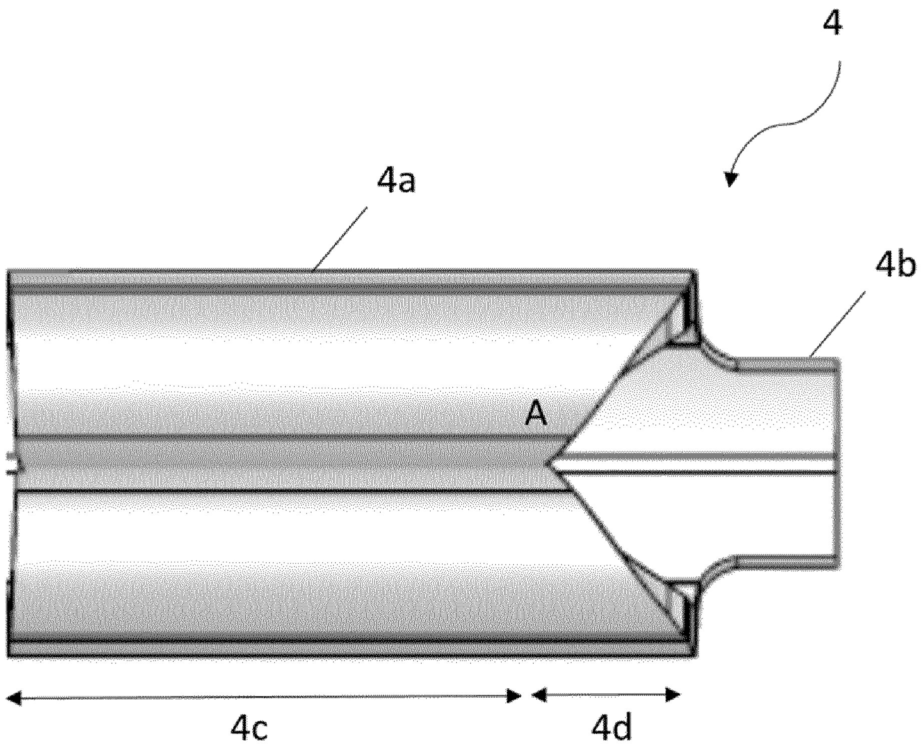
FIG. 4 is plan view of another electrical crimp connector according to the invention.

Referring to FIG. 4, according to the invention, an electrical crimp connector (4) comprises a body (4*a*) and a tail (4*b*). The body (4*a*) and the tail (4*b*) are made in a single piece. To minimize the size of the electrical crimp connector (4), the body (4*a*) is composed of two parts, a crimping part with the crimp wings (4*c*) and a cut part (4*d*). This cut part (4*d*) allows the folding of the cable (6) with a limited length of the electrical crimp connector (4). The tail (4*b*) protrudes at least 10% of the length of the intersection of the crimping part (4*c*) of the body of the electrical crimp connector (4). The cut part (4*d*) is opened on the cable (6) with an angle (A). The angle (A) is at least 80° and no more than 150° and preferably between 95° and 120°. An angle of 180° corresponds to the embodiment of FIG. 3.

In one embodiment referring to FIG. 4, the electrical crimp connector (4) is about 5 mm. The crimping part (4*c*) is about 3.2 mm. The cut part (4*d*) and the tail (4*b*) is about 1.8 mm. The angle (A) is about 105°. The electrical crimp connector (4) is made of Copper.

The invention claimed is:

1. A glazing panel comprising:

a substrate with an electrically conductive structure;

an electrical crimp connector soldered by soldering material to the electrically conductive structure; and an electrical cable, wherein the electrical crimp connector comprises a body with crimp wings and a tail that does not have crimp wings;

wherein the cable is crimped with crimp wings of the body of the electrical crimp connector; and wherein the tail of said electrical crimp connector protrudes from the body of the electrical crimp connector at least 10% of a length of an intersection of the crimp wings of the electrical crimp connector to avoid a wicking effect between the soldering material and the cable.

2. The glazing panel according to claim 1, wherein the tail protrudes from the body of the electrical crimp connector at least a diameter of the cable.

3. The glazing panel according to claim 1, wherein the substrate is a glass substrate.

4. The glazing panel according to claim 1, wherein the tail extends below the cable as the cable exits the body with crimp wings of the electrical crimp connector where the cable is crimped with the crimp wings.

5. An electrical crimp connector, comprising:

a body with crimp wings; and a tail that does not have crimp wings, wherein the body allows crimping an electrical cable with said body of the electrical crimp connector and the tail of said electrical crimp connector protrudes at least at a region of an output of the cable, wherein the tail protrudes from the body of the electrical crimp connector at least a diameter of the cable, and wherein the tail protrudes from the body of the electrical crimp connector at least 10% of a length of an intersection of the crimp wings of the electrical crimp connector.

6. The electrical crimp connector according to claim 5, wherein the tail extends below the cable as the cable exits the body with crimp wings of the electrical crimp connector where the cable is crimped with the crimp wings.

7. A glazing panel comprising:

a substrate with an electrically conductive structure;

an electrical crimp connector soldered by soldering material to the electrically conductive structure; and an electrical cable, wherein the electrical crimp connector comprises a body with crimp wings and a tail that does not have crimp wings;

wherein the cable is crimped with crimp wings of the body of the electrical crimp connector;

wherein the tail of said electrical crimp connector protrudes from the body of the electrical crimp connector and extends between the cable and the substrate as the cable exits a section of the electrical crimp connector where the cable is crimped with crimp wings, and wherein the tail protrudes from the body of the electrical crimp connector at least 10% of a length of an intersection of the crimp wings of the electrical crimp connector.

8. The glazing panel according to claim 7, wherein the tail protrudes from the body of the electrical crimp connector at least a diameter of the cable.

9. The glazing panel according to claim 7, wherein the substrate is a glass substrate.

10. The glazing panel according to claim 7, wherein the tail extends below the cable as the cable exits the body with crimp wings of the electrical crimp connector where the cable is crimped with the crimp wings.

* * * * *